(12) United States Patent
Aher et al.

(10) Patent No.: US 11,521,640 B2
(45) Date of Patent: Dec. 6, 2022

(54) SYSTEMS AND METHODS FOR IMPROVED AUDIO-VIDEO CONFERENCES

(71) Applicant: Rovi Guides, Inc., San Jose, CA (US)

(72) Inventors: Ankur Anil Aher, Maharashtra (IN); Charishma Chundi, Andhra Pradesh (IN)

(73) Assignee: Rovi Guides, Inc., San Jose, CA (US)

( * ) Notice: Subject to any disclaimer, the term of this patent is extended or adjusted under 35 U.S.C. 154(b) by 260 days.

(21) Appl. No.: 16/936,925

(22) Filed: Jul. 23, 2020

(65) Prior Publication Data

US 2022/0028411 A1    Jan. 27, 2022

(51) Int. Cl.
| | |
|---|---|
| G11C 19/00 | (2006.01) |
| G10L 25/51 | (2013.01) |
| G06F 3/04817 | (2022.01) |
| G10L 15/08 | (2006.01) |
| G10L 15/22 | (2006.01) |
| G10L 19/16 | (2013.01) |
| G11C 7/16 | (2006.01) |

(52) U.S. Cl.
CPC .......... *G10L 25/51* (2013.01); *G06F 3/04817* (2013.01); *G10L 15/08* (2013.01); *G10L 15/22* (2013.01); *G10L 19/167* (2013.01); *G10L 2015/223* (2013.01); *G11C 7/16* (2013.01)

(58) Field of Classification Search
CPC combination set(s) only.
See application file for complete search history.

(56) References Cited

U.S. PATENT DOCUMENTS

| | | | |
|---|---|---|---|
| 8,213,580 | B2 | 7/2012 | Chen et al. |
| 8,495,496 | B2 | 7/2013 | Bastide et al. |
| 9,720,917 | B2 | 8/2017 | Cunico et al. |
| 11,056,013 | B1 | 7/2021 | Fieldman |
| 2003/0196206 | A1 | 10/2003 | Shusman |
| 2004/0002049 | A1 | 1/2004 | Beavers et al. |
| 2008/0120101 | A1 | 5/2008 | Johnson et al. |
| 2010/0076747 | A1 | 3/2010 | Appleyard et al. |
| 2012/0166184 | A1 | 6/2012 | Locker et al. |
| 2013/0141516 | A1 | 6/2013 | Baldwin |
| 2013/0336628 | A1 | 12/2013 | Lamb et al. |

(Continued)

FOREIGN PATENT DOCUMENTS

CA     2802706 A1    12/2012

OTHER PUBLICATIONS

U.S. Appl. No. 16/936,923, filed Jul. 23, 2020, Ankur Anil Aher.

(Continued)

*Primary Examiner* — Vu B Hang
(74) *Attorney, Agent, or Firm* — Haley Guiliano LLP

(57) ABSTRACT

Systems and methods for efficient management of an audio/video conferences is disclosed. The method includes receiving an audio question from a first user of a plurality of users connected to a conference, recording the audio question and preventing an immediate transmission of the audio question to the plurality of users connected to the conference, analyzing the recorded audio question to determine that the audio question is relevant to a second user of the plurality of users and not relevant to a third user of the plurality of users, preventing the audio question from being transmitted to the third user, and transmitting the audio question to the second user of the plurality of users.

18 Claims, 11 Drawing Sheets

(56) References Cited

U.S. PATENT DOCUMENTS

| | | |
|---|---|---|
| 2014/0013230 A1 | 1/2014 | Malone |
| 2014/0164304 A1 | 6/2014 | Bagchi et al. |
| 2015/0317123 A1* | 11/2015 | Wu ................ H04M 3/568 |
| | | 715/727 |
| 2016/0105566 A1 | 4/2016 | Klemm et al. |
| 2016/0182580 A1 | 6/2016 | Nayak |
| 2016/0239489 A1 | 8/2016 | Cunico et al. |
| 2016/0239537 A1* | 8/2016 | Cunico ............... G09B 7/00 |
| 2017/0039867 A1 | 2/2017 | Fieldman |
| 2017/0061019 A1* | 3/2017 | Chitta ............... H04L 51/216 |
| 2019/0392832 A1 | 12/2019 | Mitsui et al. |
| 2022/0028410 A1 | 1/2022 | Aher et al. |
| 2022/0028412 A1 | 1/2022 | Aher et al. |

OTHER PUBLICATIONS

U.S. Appl. No. 16/936,926, filed Jul. 23, 2020, Ankur Anil Aher.
Aitor Rodriguez-Alsina et al., "Subtitle synchronization across multiple screens and devices," Sensors, Jun. 2012, 12, pp. 8710-8731.

* cited by examiner

SYSTEMS AND METHODS FOR IMPROVED AUDIO-VIDEO CONFERENCES

BACKGROUND

The present disclosure relates to audio/video conferencing systems and methods, and more particularly, to systems and methods related to managing multiple participants connected to an audio/video conference.

SUMMARY

Recently the use of audio/video conferencing systems has become increasingly popular. These audio/video-conferencing systems are adapted to provide multi-party audio/video conferences where many participants participate in an audio/video conference through interaction with an audio/video-conferencing server.

Conventional audio-conferencing systems have a series of listeners or participants at geographically dispersed locations with each listener participant having audio input equipment such as microphones or the like in addition to audio output equipment such as speakers, headphones, or the like for listening to other participants. The audio input and output devices are normally interconnected by means of an electronic audio signaling path, and often, though not restricted to, a central server. The central server is responsible for managing the incoming audio from each of the participants. In some embodiments, the central server collects audio from all participants, and transmits the combined signal to be played to each participant in real time. In some embodiments, the conferencing system may be a peer-to-peer conference, where each device of each participant transmits its voice data to each other device and plays back all received audio signals in real time.

However, such a system may be particularly inefficient when a single presenter is giving a presentation to a number of participants connected to a conference. For example, the presenter being interrupted by questions from the participants may be inefficient (for example because other participants may miss important information when the voice of the presenter is obscured with other audio signals). In one approach, a presenter may have allotted time for questions, but the participants might not be aware of when that might be.

In one approach, available audio-conferencing systems, provide a "Mute All" option to the presenter. The presenter is therefore able to mute all participants while giving their presentation and can unmute everyone when they are ready to take questions. Unfortunately, such systems have a number of drawbacks. In this approach, important questions or comments from other participants may be lost (e.g., if the user forgets to repeat their question or comment later).

Participants, for example, may have important input to provide during specific portions of the presentation which may get ignored by the presenter when the "Mute All" option is engaged. Moreover, participants may lose interest or forget their questions about an earlier portion of the presentation if they are unable to interact with the presenter in real time. Therefore, participants can often miss out on valuable insight from other participants connected to the conference.

Lack of management of audio input from participants can further contribute to adverse user experience when participants ask questions that may not be relevant to other participants connected to the conference. For example, on a company-wide conference, a question asked about finance regulations may not be relevant to the engineers on the team. Addressing such a question may interrupt the engagement of the other participants connected to the conference. In some cases, a participant may ask a question that has already been answered during the presentation. The presenter is therefore forced to repeat the answer for everyone thereby potentially losing engagement from the other participants and disturbing the flow of the presentation.

Audio-conferencing mechanisms, techniques, and systems described herein are introduced to facilitate convenient and efficient discussion among a plurality of participants connected to an audio/video conference.

In some embodiments, when a "Smart Presentation" mode is engaged, questions asked by participants during a presentation are prevented from being immediately (e.g., in real time) transmitted to all other participants connected to the audio/video conference. Instead, the system records the question and identifies a time during the audio/video conference when it would be appropriate to present the question to the other participants. For example, the system may identify the time for transmitting the audio question based on an expiration time for the "Smart Presentation" mode. In some embodiments, the system may analyze the audio portion of the conference looking for keywords to identify a time for transmitting the audio question to the participants (e.g., when the presenter says "Any Questions?"). In some embodiments, the system may look for a sufficiently long pause in the presentation. In further embodiments, the system may prompt the presenter to go to a question (e.g., by presenting the message "Three questions were recorded: would you like to play them back?")

In some embodiments, the system determines whether an asked question is relevant to the respective participants before transmitting the question. For example, a question asked about financial accounting policy during a company-wide meeting would not be relevant to people in the Human Resources department. Accordingly, the system prevents transmission of the question to people in the Human Resources department while transmitting the question to people in the Finance department. In this way, the system ensures that the participants connected to the audio/video conference aren't inundated with questions lacking any relevance to them. For example, the system may record the question instead of transmitting it in real time. The recorded message is analyzed and sent only to relevant recipients for playback.

The relevance of the question may be determined based on analyzing the recorded audio question in accordance with some embodiments disclosed herein. For example, the system may identify a name of a specific participant (or a title of a specific group participants, e.g., "finance team") mentioned in the audio question and only transmit the question to the named participant or the named group of participants. In one example, the system identifies one or more keywords indicative of a topic associated with the question and cross-references the topic with background information associated with each of the participants connected to the audio/video conference.

In some embodiments, the system records the question but prevents the immediate transmission of an audio question asked by a participant connected to the conference in order to determine whether the audio question has been answered during a prior portion of the conference. For instance, participants who joined late to a conference in progress or who may have missed a relevant portion often ask questions that have already been answered. This results in frustration for other participants connected to the audio/ video conference and reduces efficiency for all parties. Systems in accordance with disclosed embodiments analyze the asked question and first determine whether the question was previously answered. If it was, the audio question is not transmitted to any of the other participants. Instead, the system may send a recording of the answer (e.g., a portion of a conference that was recorded earlier) to the participant asking the question. In some embodiments, the participant asking the audio question may receive a link directing the participant to a recording of the answer. In another embodiment, the participant may receive a transcript of the recorded answer to their question. In this way, the flow of the conference is not interrupted with questions that have already been answered during the conference.

BRIEF DESCRIPTION OF THE DRAWINGS

The above and other objects and advantages of the disclosure will be apparent upon consideration of the following detailed description, taken in conjunction with the accompanying drawings, in which.

DETAILED DESCRIPTION

Methods and systems are provided herein for preventing an immediate transmission of a question asked during an audio/video conference and instead recording the question for a delayed presentation to participants having a relevant background.

Figure 1:
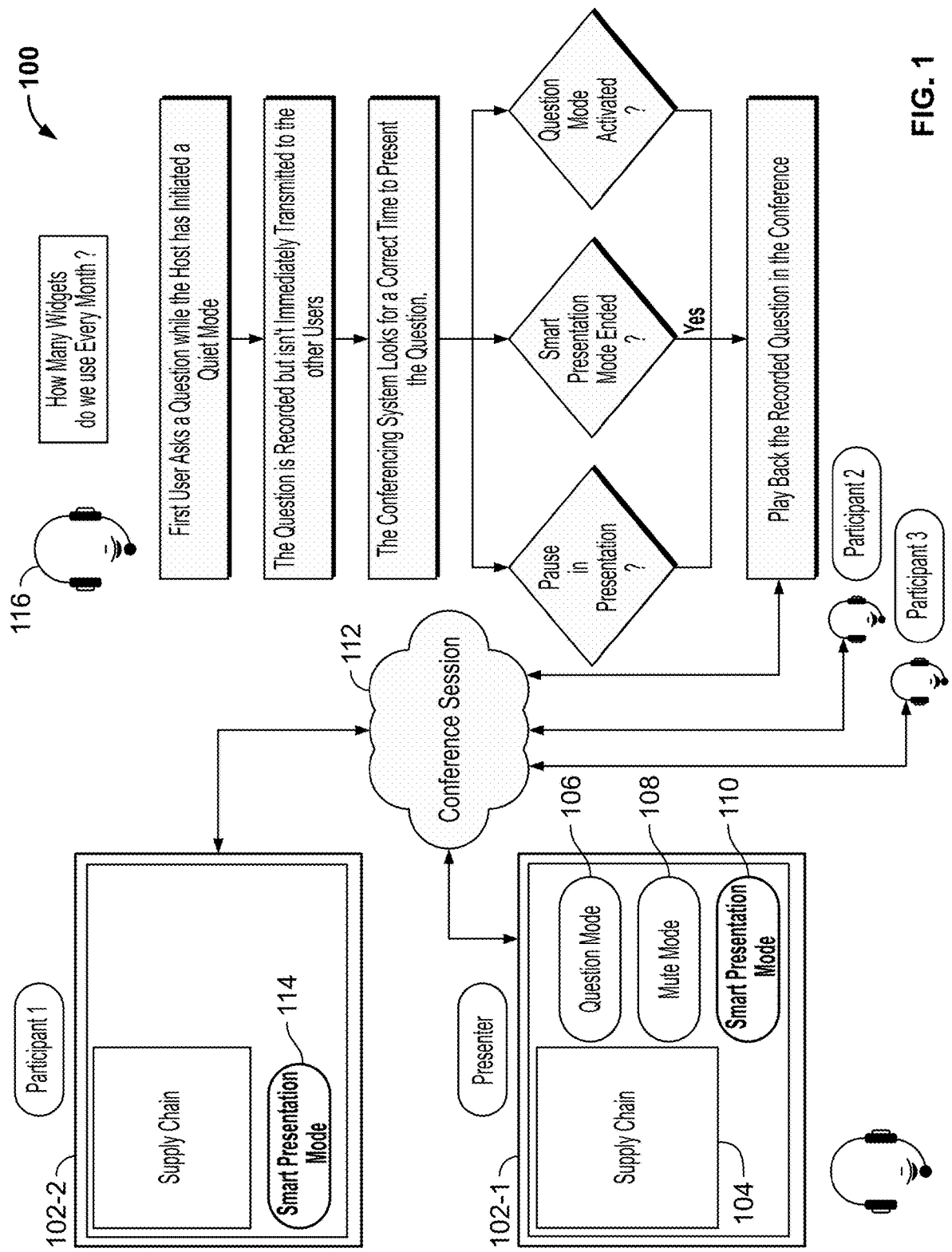
FIG. 1 illustrates an example audio/video-conferencing system, in accordance with some embodiments of the disclosure.

FIG. 1 depicts an exemplary audio/video-conference setup 100 with participants 1-3 being connected with a presenter via a conference session 112. An example display screen 102-1 of the presenter that is provided on a display of a user device in communication with a server displays a number of selectable menu options for management of the audio/video conference. For example, selectable menu option 106 indicates to the other participants (e.g., Participants 1-3) that the presenter is ready to take questions. Selectable menu option 108 may be a "Mute All" mode in which all participants connected to the audio/video conference are muted. Selectable menu option 110 is a "Smart Presentation" mode which allows the presenter to more efficiently manage the audio/video conference. In an embodiment, user equipment 102-2 displays a button 114 indicating that the presenter has engaged the "Smart Presentation" mode. In an embodiment, a first user (e.g., Participant 1) may ask a question using their audio input equipment (e.g., headset 116).

Specifically, in accordance with an embodiment of the disclosure, when the presenter selects "Smart Presentation" mode 110, questions asked by a first user connected to the conference (e.g., Participant 1) are prevented from being immediately transmitted to all of the participants connected to the audio/video-conference. Instead the questions are recorded for a delayed transmission. In an embodiment, the question may be recorded and stored on the user equipment 102-2 associated with the participant asking the question (e.g., Participant 1). In another embodiment, the question may be recorded and stored on a cloud server 112.

The conferencing system then identifies a correct time to present the recorded question to the participants connected to the conference. For example, in one embodiment, the question is transmitted when the presenter selects "Question" mode 106 or when the presenter ends the "Smart Presentation" mode 110. In another embodiment, the system analyses the voice output from the Presenter to identify a time when the presenter indicates their willingness to take questions. For example, the system may look for key phrases such as "Let's pause for any questions!" uttered by the presenter. In still another embodiment, the system transmits the recorded question when a predetermined threshold number of questions have been asked by the participants without a response from the presenter (e.g., when three or more questions are queued up for the presenter to answer).

Once one of the above conditions is met, the system transmits the recorded question to the participants connected to the conference. For example, the system may transmit the audio recording of the question to all participants connected to the conference in accordance with one embodiment of the disclosure. In another embodiment, the audio question may be transmitted only to the presenter. In still another embodiment, a transcript of the audio question may be transmitted to all the participants connected to the conference. In one embodiment, the system provides the first user an option to rephrase the recorded question. This allows for the first user to revisit the question to check for its relevance if, for instance, the question has since been answered by the presenter. The resulting discussion is therefore more productive for all participants of the conference, thereby increasing efficiency.

Figure 2:
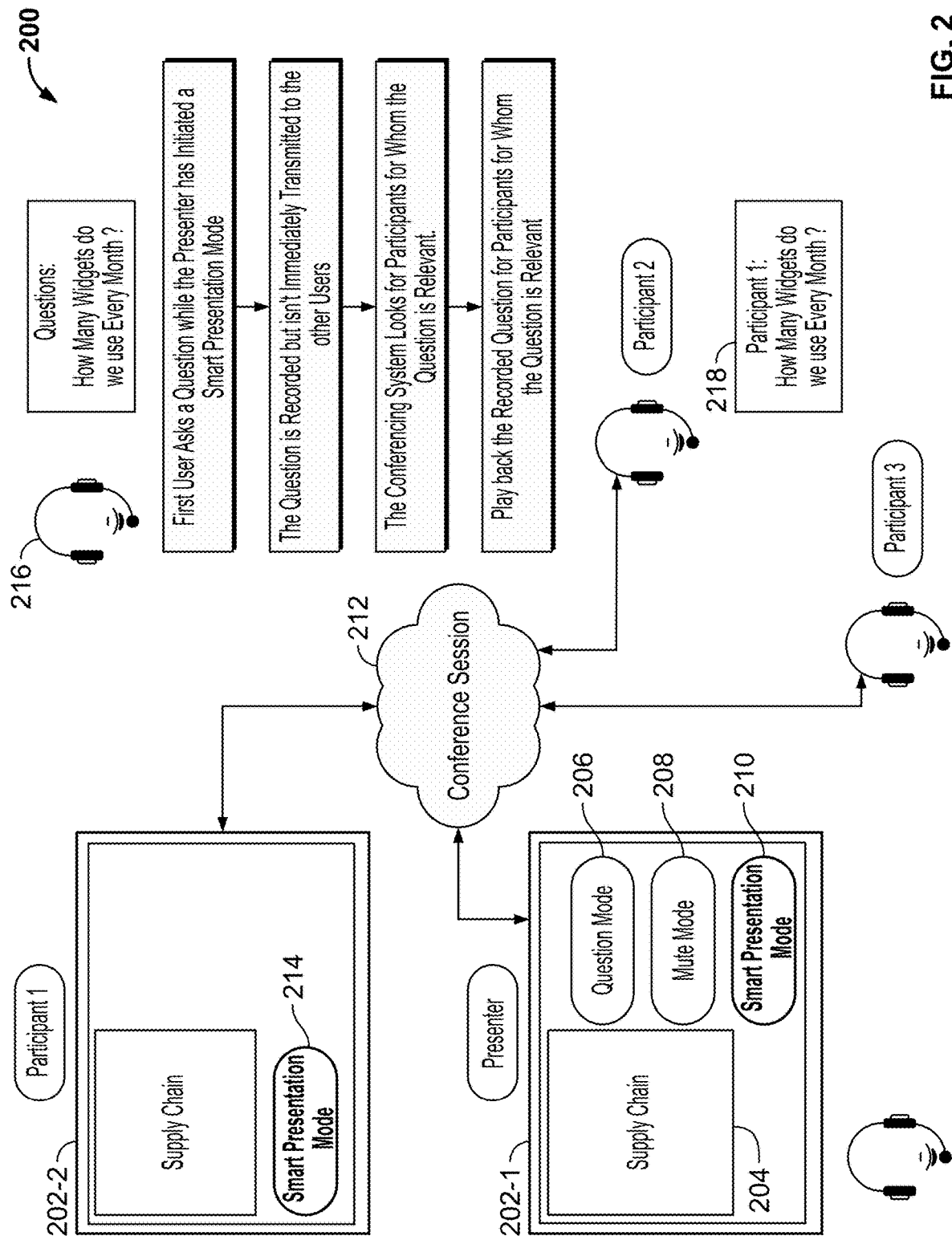
FIG. 2 illustrates an example audio/video-conferencing system, in accordance with some embodiments of the disclosure.

FIG. 2 depicts an exemplary audio/video-conference setup 200 with participants 1-3 being connected with a presenter via a conference session 212. An example display screen 202-1 of the presenter that is provided on a display of a user device in communication with a server displays a number of selectable menu options for management of the audio/video conference. For example, selectable menu option 206 indicates to the other participants (e.g., Participants 1-3) that the presenter is ready to take questions. Selectable menu option 208 may be a "Mute All" mode in which all participants connected to the audio/video conference are muted. Selectable menu option 210 is a "Smart Presentation" mode which allows the presenter to more efficiently manage the audio/video conference. In an embodiment, user equipment 202-2 displays a button 214 indicating that the Presenter has engaged the "Smart Presentation" mode. In an embodiment, a first user (e.g., Participant 1) may ask a question using their audio input equipment (e.g., headset 216).

Specifically, in accordance with an embodiment of the disclosure, when the presenter selects "Smart Presentation" mode 210, questions asked by a first user connected to the conference (e.g., Participant 1) are prevented from being immediately transmitted to all of the participants connected to the audio/video-conference. Instead, the questions are recorded for a delayed transmission. In an embodiment, the question may be recorded and stored on the user equipment 202-2 associated with the participant asking the question (e.g., Participant 1). In another embodiment, the question may be recorded and stored on a cloud server 212.

As discussed above, in conventional audio/video conference systems, questions asked by participants connected to the conference are transmitted immediately to all other participants, which often interrupts the flow of the presentation. Moreover, the asked question may not be relevant to all connected participants. Accordingly, the conferencing system, in accordance with embodiments disclosed here, identifies participants for whom the asked question is relevant.

In an embodiment, the system determines that the asked question is relevant to a second user based on analyzing the recorded audio question to determine that a name of the second user was referenced. For example, if Participant 1, when asking a question, references Participant 2 by name, the system transmits the asked question to only Participant 2 while preventing transmission of the question to Participant 3.

In another embodiment, the system determines that the asked question is relevant to a second user based on analyzing the recorded audio question to identify a keyword referenced in the question and cross-referencing the identified keyword with a plurality of keywords associated with a respective background of each of the plurality of users to find a match. For example, when Participant 1 asks a question about the number of widgets available for sale, the system identifies participants who have a relevant background related to sale of widgets (e.g., employees on the sales team) as well as participants who do not have relevant background related to sale of widgets (e.g., employees in Human Resources). In one embodiment, the system may review the job titles of each of the participants connected to the conference to determine whether they have a relevant background for the asked question.

Once the system has identified participants for whom the asked question is relevant, the asked audio question is transmitted to the identified participants. In one embodiment, a selectable icon notifying the second user of the audio question by the first user is transmitted to the second user. In response to detecting a selection of the selectable icon by the second user, the recorded audio question is transmitted to an electronic device of the second user. In an embodiment, a transcript of the asked question is transmitted to the second user using a "chat" function. Accordingly, the second user is able to provide an answer to the asked question without interrupting the presentation or disengaging other users connected to the conference who do not have a relevant background.

Figure 3:
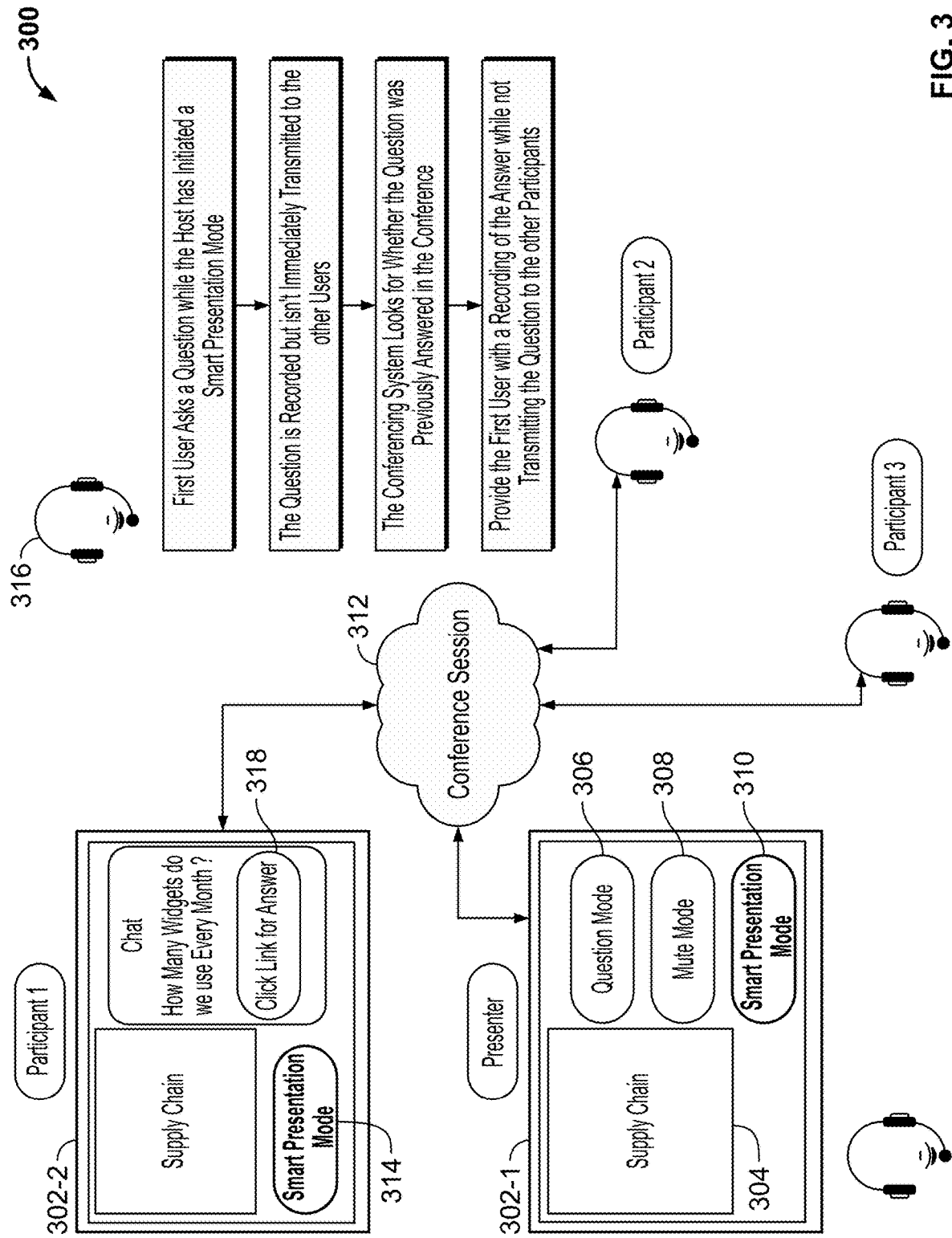
FIG. 3 illustrates an example audio/video-conferencing system, in accordance with some embodiments of the disclosure.

FIG. 3 depicts an exemplary audio/video-conference setup 300 with participants 1-3 being connected with a presenter via a conference session server 312. An example display screen 302-1 of the presenter that is provided on a display of a user device in communication with a server displays a number of selectable menu options for management of the audio/video conference. For example, selectable menu option 306 indicates to the other participants (e.g., Participants 1-3) that the presenter is ready to take questions. Selectable menu option 308 may be a "Mute All" mode in which all participants connected to the audio/video conference are muted. Selectable menu option 310 is a "Smart Presentation" mode which allows the presenter to more efficiently manage the audio/video conference. In an embodiment, user equipment 302-2 displays a button 314 indicating that the presenter has engaged the "Smart Presentation" mode. In an embodiment, a first user (e.g., Participant 1) may ask a question using their audio input equipment (e.g., headset 316).

Specifically, in accordance with an embodiment of the disclosure, when the presenter selects "Smart Presentation" mode 310, questions asked by a first user connected to the conference (e.g., Participant 1) are prevented from being immediately transmitted to all of the participants connected to the audio/video-conference. Instead, the questions are recorded for a delayed transmission. In an embodiment, the question may be recorded and stored on the user equipment 302-2 associated with the participant asking the question (e.g., Participant 1). In another embodiment, the question may be recorded and stored on a conference session server 312.

Next, the system analyzes the recorded question and a recorded portion of the conference to determine that the question has been answered during the recorded portion of the conference. For example, in accordance with an embodiment, the system determines that the question has been answered during the recorded portion of the conference by identifying one or more keywords spoken in the recorded audio question and parsing the recorded portion of the conference to identify the relevant section where the identified one or more keywords were uttered. For example, when the question asked by Participant 1 references sale of widgets, the system may determine that the sales numbers were discussed during the first ten minutes of the presentation.

In another embodiment, the system determines that the question has been answered during the recorded portion of the conference by transmitting a notification to a presenter of the conference with the recorded audio question and receiving, from the presenter, an indication of the relevant portion of the recorded portion of the conference consisting of the answer to the audio question.

Once the relevant portion is identified, the system transmits the relevant section of the recorded portion of the conference consisting of the answer to the audio question to the first user by transmitting the relevant section of the recorded portion of the conference in a new window on an electronic device of the first user. In still another embodiment, the system transmits the relevant section of the recorded portion of the conference consisting of the answer to the audio question to the first user by transmitting a transcript of the relevant section.

In one embodiment, the system transmits the relevant section of the recorded portion of the conference consisting of the answer to the audio question to the first user by transmitting a selectable icon 318 notifying the first user of the relevant section of the recorded portion of the conference consisting of the answer to the audio question. In response to detecting a selection of the selectable icon 318, the relevant section is transmitted to an electronic device of the first user. Accordingly, in accordance with embodiments discussed here, the other participants connected to the conference aren't interrupted by repetition of material covered earlier during the conference, thereby making the conference more productive for all connected participants.

Figure 4:
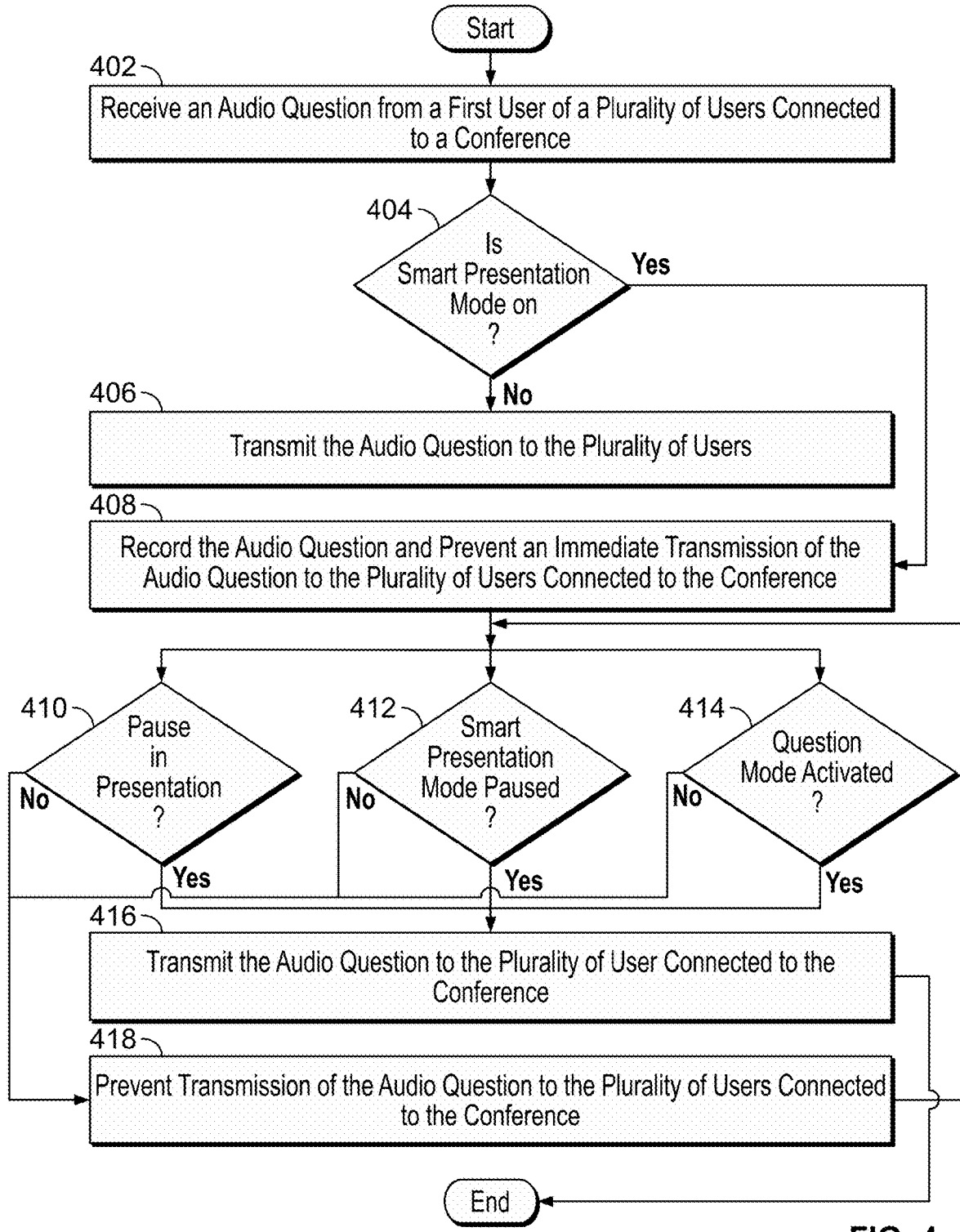
FIG. 4 is a flowchart of illustrative steps involved in delaying transmission of an asked question to all participants connected to an audio/video conference until an appropriate time, in accordance with some embodiments of the disclosure.

FIG. 4 is a flowchart of a process 400 of illustrative steps involved in delaying transmission of an asked question to all participants connected to an audio/video conference until an appropriate time, in accordance with some embodiments of the disclosure. It should be noted that process 400 or any step thereof could be performed on, or provided by, any of the devices shown in FIG. 11 and can incorporate various user interfaces (e.g., display screens of FIGS. 1-3). For example, process 400 may be executed by control circuitry 1128 (FIG. 11) of the user equipment 1118. In addition, one or more steps of process 400 may be incorporated into or combined with one or more steps of any other process or embodiment (e.g., process 500 of FIG. 5, process 600 of FIG. 6, process 700 of FIG. 7, process 800 of FIG. 8, process 900 of FIG. 9, process 1000 of FIG. 10).

At 402, an audio question is received from a first user of a plurality of users connected to a conference. For example, as shown in FIG. 1, Participant 1 asks a question during a presentation via headset 116. At 404, the system determines whether the "Smart Presentation" mode is on. For example, the system determines whether the presenter has selected the "Smart Presentation" mode button 110 on user equipment 102-1. If it is determined that the "Smart Presentation" mode is not on (NO at 404), the process proceeds to 406 and the audio question is transmitted to the plurality of users connected to the conference. If, on the other hand, it determined that the "Smart Presentation" mode is on (YES at 404), the process proceeds to 408. At 408, the audio question is recorded and an immediate transmission of the audio question to the plurality of users connected to the conference is prevented.

Next, the system determines when to transmit the recorded audio question to the plurality of users. Specifically, at 410, the system determines whether there is a pause in the presentation. For instance, the system analyzes the keywords spoken by the presenter to identify a pause in the presentation (e.g., the presenter says "Let's take a break for questions"). At 412, the system determines whether the "Smart Presentation" mode is paused. For example, the system determines whether the presenter has unselected the "Smart Presentation" mode button 110 on user equipment 102-1. At 414, the system determines whether the "Question" mode is on. For example, the system determines whether Presenter has selected the "Question" mode button 106 on user equipment 102-1.

If the system determines that any of the above conditions were met (YES at 410/412/414), the process proceeds to 416 and the audio question is transmitted to the plurality of users connected to the conference. If, on the other hand, the system determines that any of the above conditions were not met (NO at 410/412/414), the process proceeds to 418, and transmission of the audio question to the plurality of users connected to the conference is prevented until one of these conditions is met. In this way, the system ensures that the participants connected to the conference aren't constantly interrupted by questions.

Figure 5:
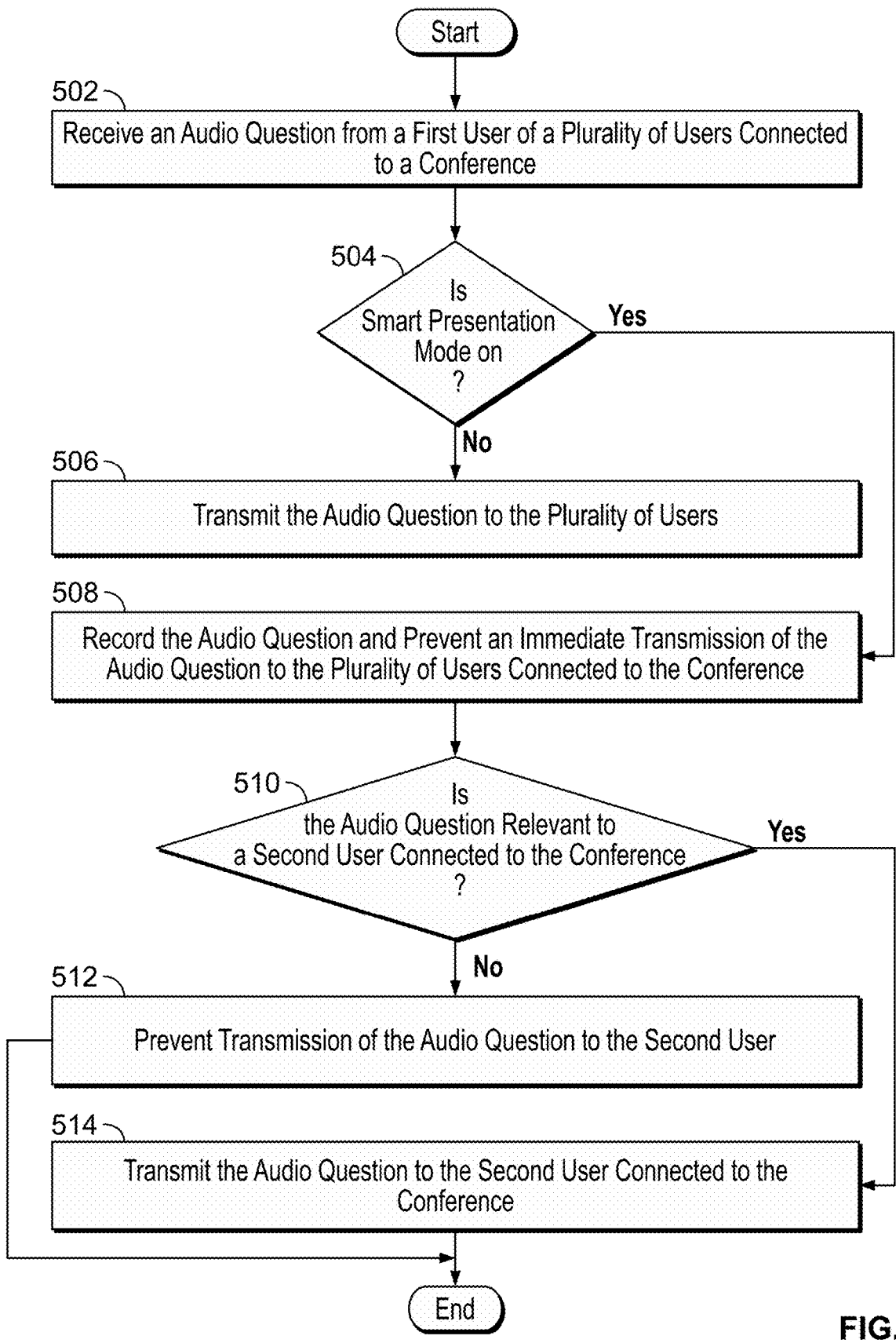
FIG. 5 is a flowchart of illustrative steps involved in limiting transmission of an asked question to only the participants having a relevant background, in accordance with some embodiments of the disclosure.

FIG. 5 is a flowchart of a process 500 of illustrative steps involved in limiting transmission of an asked question to only the participants having a relevant background, in accordance with some embodiments of the disclosure. It should be noted that process 500 or any step thereof could be performed on, or provided by, any of the devices shown in FIG. 11 and can incorporate various user interfaces (e.g., display screens of FIGS. 1-3). For example, process 500 may be executed by control circuitry 1128 (FIG. 11) of the user equipment 1118. In addition, one or more steps of process 500 may be incorporated into or combined with one or more steps of any other process or embodiment (e.g., process 400 of FIG. 4, process 600 of FIG. 6, process 700 of FIG. 7, process 800 of FIG. 8, process 900 of FIG. 9, process 1000 of FIG. 10).

At 502, an audio question is received from a first user of a plurality of users connected to a conference. For example, as shown in FIG. 2, Participant 1 asks a question during a presentation via headset 216. At 504, the system determines whether the "Smart Presentation" mode is on. For example, the system determines whether the presenter has selected the "Smart Presentation" mode button 210 on user equipment 202-1. If it is determined that the "Smart Presentation" mode is not on (NO at 504), the process proceeds to 506 and the audio question is transmitted to the plurality of users connected to the conference. If, on the other hand, it determined that the "Smart Presentation" mode is on (YES at 504), the process proceeds to 508. At 508, the audio question is recorded and an immediate transmission of the audio question to the plurality of users connected to the conference is prevented.

Next, at 510, the system determines whether the audio question is relevant to a second user connected to the conference. If the system determines that the audio question is not relevant to the second user connected to the conference (NO at 510), the process proceeds to 512, and transmission of the question to the second user is prevented. If, on the other hand, the system determines that the audio question is relevant to the second user connected to the conference (YES at 510), the process proceeds to 514. At 514, the audio question is transmitted to the second user. For example, when Participant 1 asks a question about the number of widgets available for sale, the system determines whether the participants have a relevant background related to sale of widgets (e.g., employees on the sales team) or do not have relevant background related to sale of widgets (e.g., employees in Human Resources). Accordingly, the system ensures that any audio questions asked during the conference are transmitted only to participants for whom the question is relevant, while avoiding unnecessary interruptions for other participants.

Figure 6:
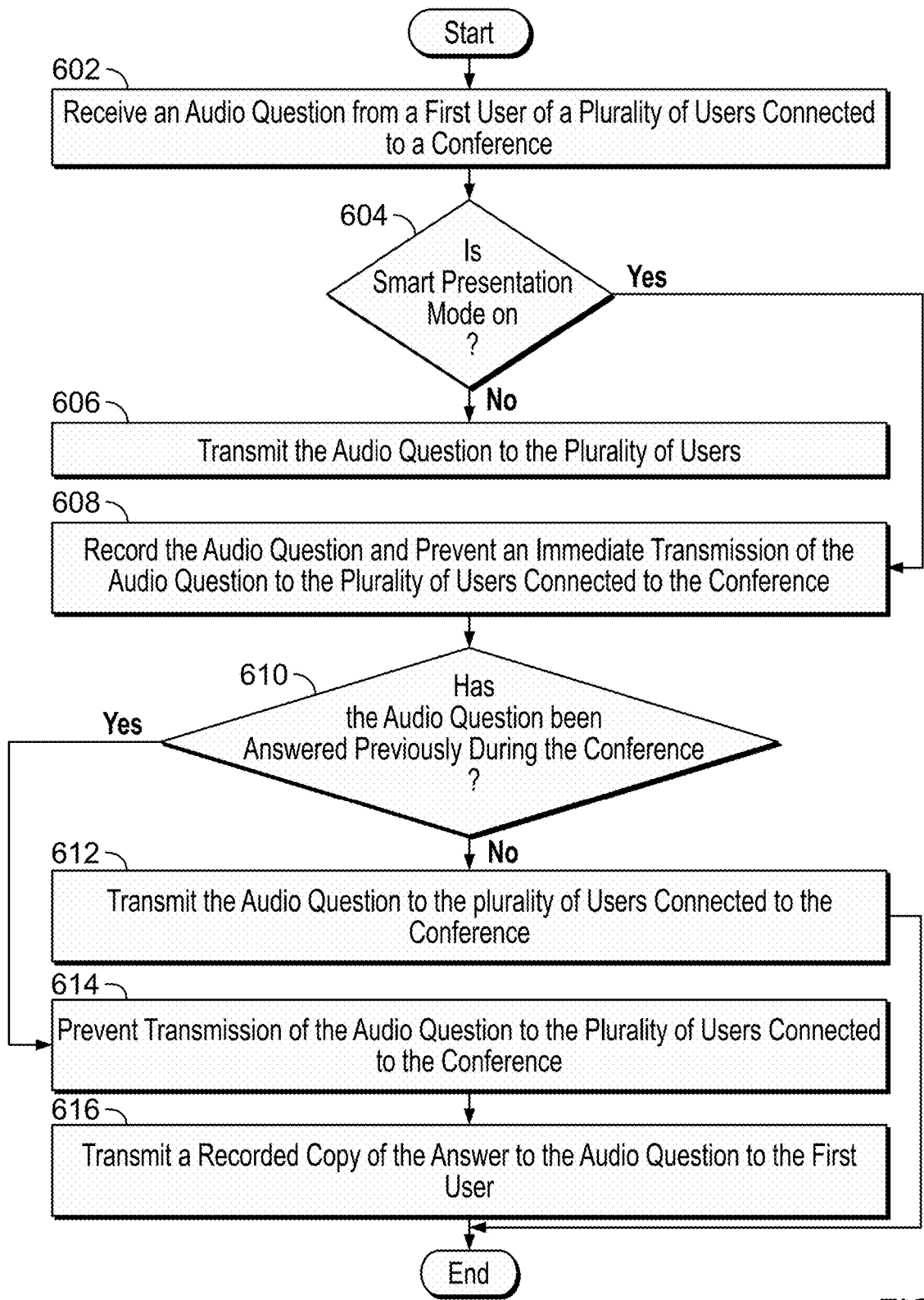
FIG. 6 is a flowchart of illustrative steps involved in preventing transmission of an asked question to all participants when the question has been previously answered, in accordance with some embodiments of the disclosure.

FIG. 6 is a flowchart of a process 600 of illustrative steps involved in preventing transmission of an asked question to all participants when the question has been previously answered, in accordance with some embodiments of the disclosure. It should be noted that process 600 or any step thereof could be performed on, or provided by, any of the devices shown in FIG. 11 and can incorporate various user interfaces (e.g., displays screens of FIGS. 1-3). For example, process 600 may be executed by control circuitry 1128 (FIG. 11) of the user equipment 1118. In addition, one or more steps of process 600 may be incorporated into or combined with one or more steps of any other process or embodiment (e.g., process 400 of FIG. 4, process 500 of FIG. 5, process 700 of FIG. 7, process 800 of FIG. 8, process 900 of FIG. 9, process 1000 of FIG. 10).

At 602, an audio question is received from a first user of a plurality of users connected to a conference. For example, as shown in FIG. 3, Participant 1 asks a question during a presentation via headset 316. At 604, the system determines whether the "Smart Presentation" mode is on. For example, the system determines whether the presenter has selected the "Smart Presentation" mode button 310 on user equipment 302-1. If it is determined that the "Smart Presentation" mode is not on (NO at 604), the process proceeds to 606 and the audio question is transmitted to the plurality of users connected to the conference. If, on the other hand, it determined that the "Smart Presentation" mode is on (YES at 604), the process proceeds to 608. At 608, the audio question is recorded and an immediate transmission of the audio question to the plurality of users connected to the conference is prevented.

Next, at 610, the system determines whether the audio question has previously been answered during a prior portion of the conference. If the system determines that the audio question has not previously been answered during a prior portion of the conference (NO at 610), the process proceeds 612 and the audio question is transmitted to the plurality of users connected to the conference. If, on the other hand, the system determines that the audio question has previously been answered during a prior portion of the conference (YES at 610), the process proceeds to 614, and transmission of the audio question to the plurality of users connected to the conference is prevented. At 616, the system retrieves and transmits a recorded copy of the answer to the audio question to the first user asking the question. Accordingly, the system ensures that any audio questions asked during the conference haven't previously been answered thereby avoiding unnecessary interruptions for other participants.

Figure 7:
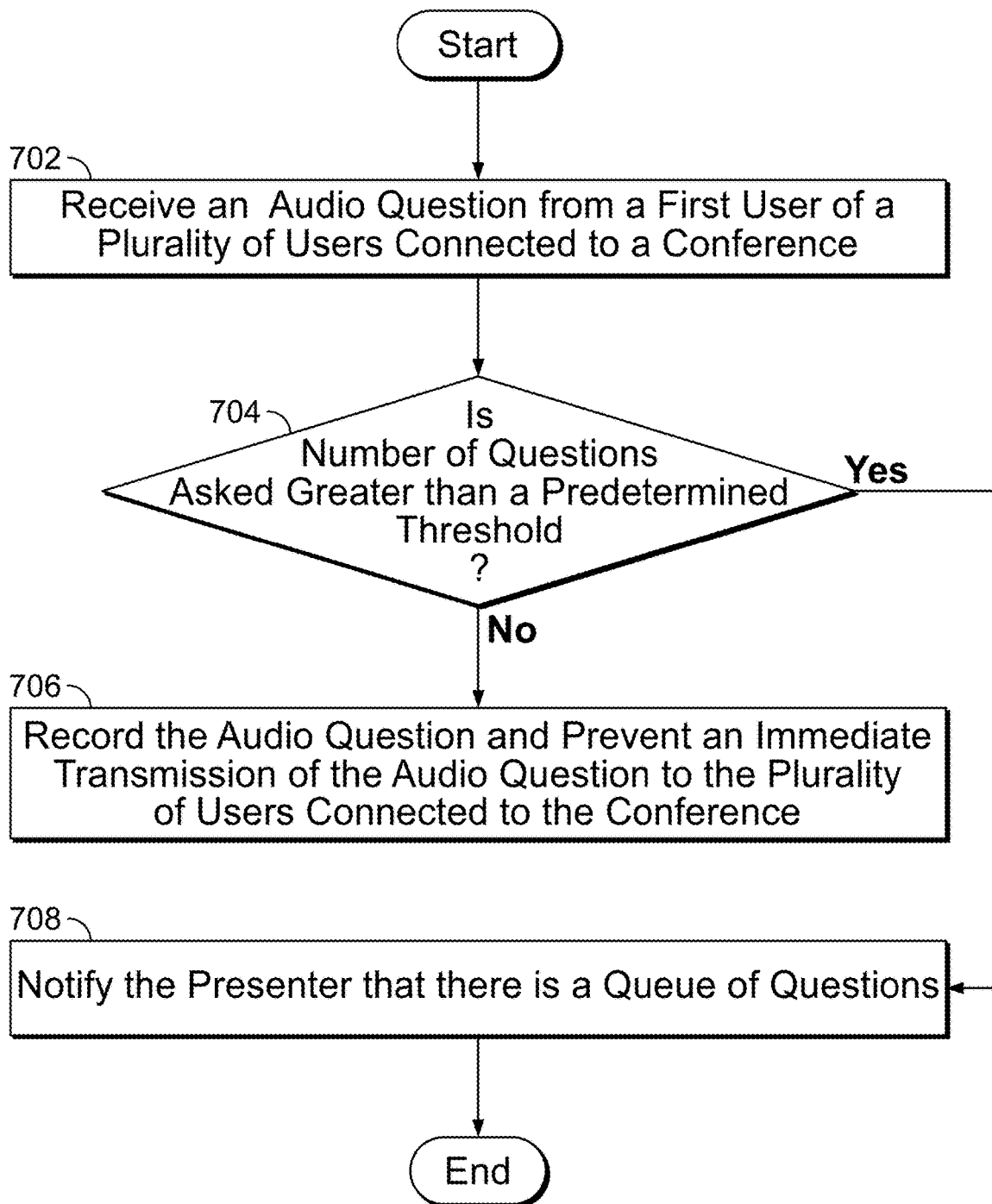
FIG. 7 is a flowchart of illustrative steps involved in determining whether to transmit a question asked by a first user, in accordance with some embodiments of the disclosure.

FIG. 7 is a flowchart of a process 700 of illustrative steps involved in determining whether to transmit a question asked by a first user, in accordance with some embodiments of the disclosure. It should be noted that process 700 or any step thereof could be performed on, or provided by, any of the devices shown in FIG. 11 and can incorporate various user interfaces (e.g., displays screens of FIGS. 1-3). For example, process 700 may be executed by control circuitry 1128 (FIG. 11) of the user equipment 1118. In addition, one or more steps of process 700 may be incorporated into or combined with one or more steps of any other process or embodiment (e.g., process 400 of FIG. 4, process 500 of FIG. 5, process 600 of FIG. 6, process 800 of FIG. 8, process 900 of FIG. 9, process 1000 of FIG. 10).

At 702, an audio question is received from a first user of a plurality of users connected to a conference. At 704, the system determines whether the number of questions already asked by the plurality of users exceeds a predetermined threshold. For instance, the system determines whether there have already been more than three questions that have been asked by the plurality of users connected to the conference. If it is determined that the number of questions asked does exceed the predetermined threshold (YES at 704), the process proceeds to 706 and the audio question is recorded and an immediate transmission of the audio question to the plurality of users connected to the conference is prevented. If, on the other hand, it determined that the number of questions asked does not exceed the predetermined threshold (NO at 704), the process proceeds to 708 and the presenter is notified on the queue of questions. In this manner, the system ensures that the presenter timely answers the questions of the participants connected to the conference while preventing unnecessary frequent interruptions to the conference.

Figure 8:
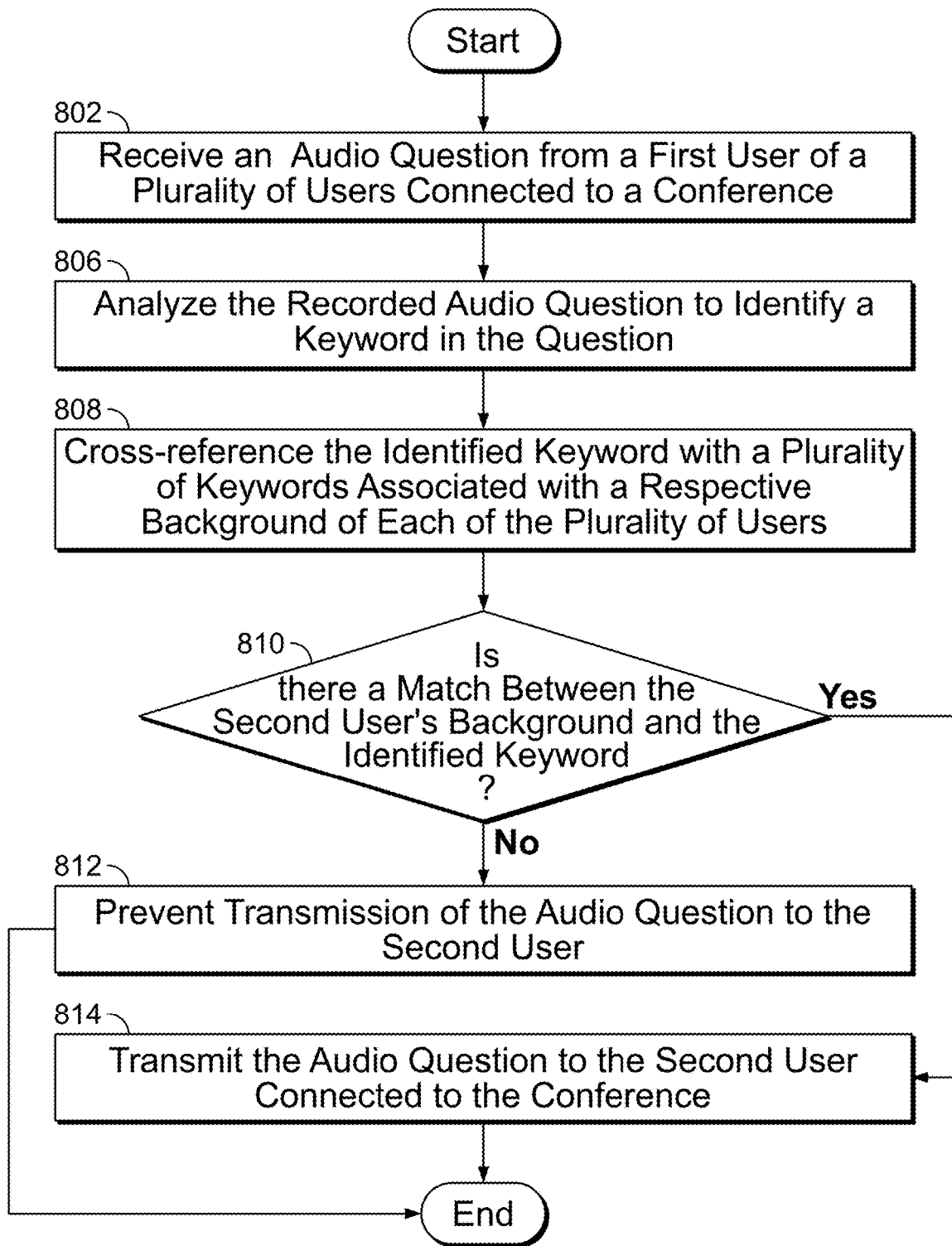
FIG. 8 is a flowchart of illustrative steps involved in determining whether an asked question is relevant to a user, in accordance with disclosed methods and embodiments.

FIG. 8 depicts a flowchart of a process 800 of illustrative steps involved in determining whether an asked question is relevant to a user, in accordance with some embodiments disclosed herein. It should be noted that process 800 or any step thereof could be performed on, or provided by, any of the devices shown in FIG. 11 and can incorporate various user interfaces (e.g., display screens of FIGS. 1-3). For example, process 800 may be executed by control circuitry 1128 (FIG. 11) of the user equipment 1118. In addition, one or more steps of process 800 may be incorporated into or combined with one or more steps of any other process or embodiment (e.g., process 400 of FIG. 4, process 500 of FIG. 5, process 600 of FIG. 6, process 700 of FIG. 7, process 900 of FIG. 9, process 1000 of FIG. 10).

At 802, an audio question is received from a first user of a plurality of users connected to a conference. At 806, the received audio question is recorded and analyzed to identify a keyword in the question. For instance, the received audio question is analyzed to determine a specific topic mentioned in the question (e.g., mention of sales numbers). At 808, the system cross-references the identified keyword with a plurality of keywords associated with a respective background of each of the plurality of users to find a match.

At 810, the system determines whether there is a match between a second user's background and the identified keyword from the recorded question. If it is determined that there is no match between the second user's background and the identified keyword from the recorded question (NO at 810), the system proceeds to 812 and transmission of the audio question to the second user is prevented. If, on the other hand, it is determined that there is a match between the second user's background and the identified keyword from the recorded question (YES at 810), the system proceeds to 814. At 814, the audio question is transmitted to the second user.

For example, when Participant 1 asks a question about the number of widgets available for sale, the system identifies participants who have a relevant background related to sale of widgets (e.g., employees on the sales team) as well as participants who do not have relevant background related to sale of widgets (e.g., employees in Human Resources).

Figure 9:
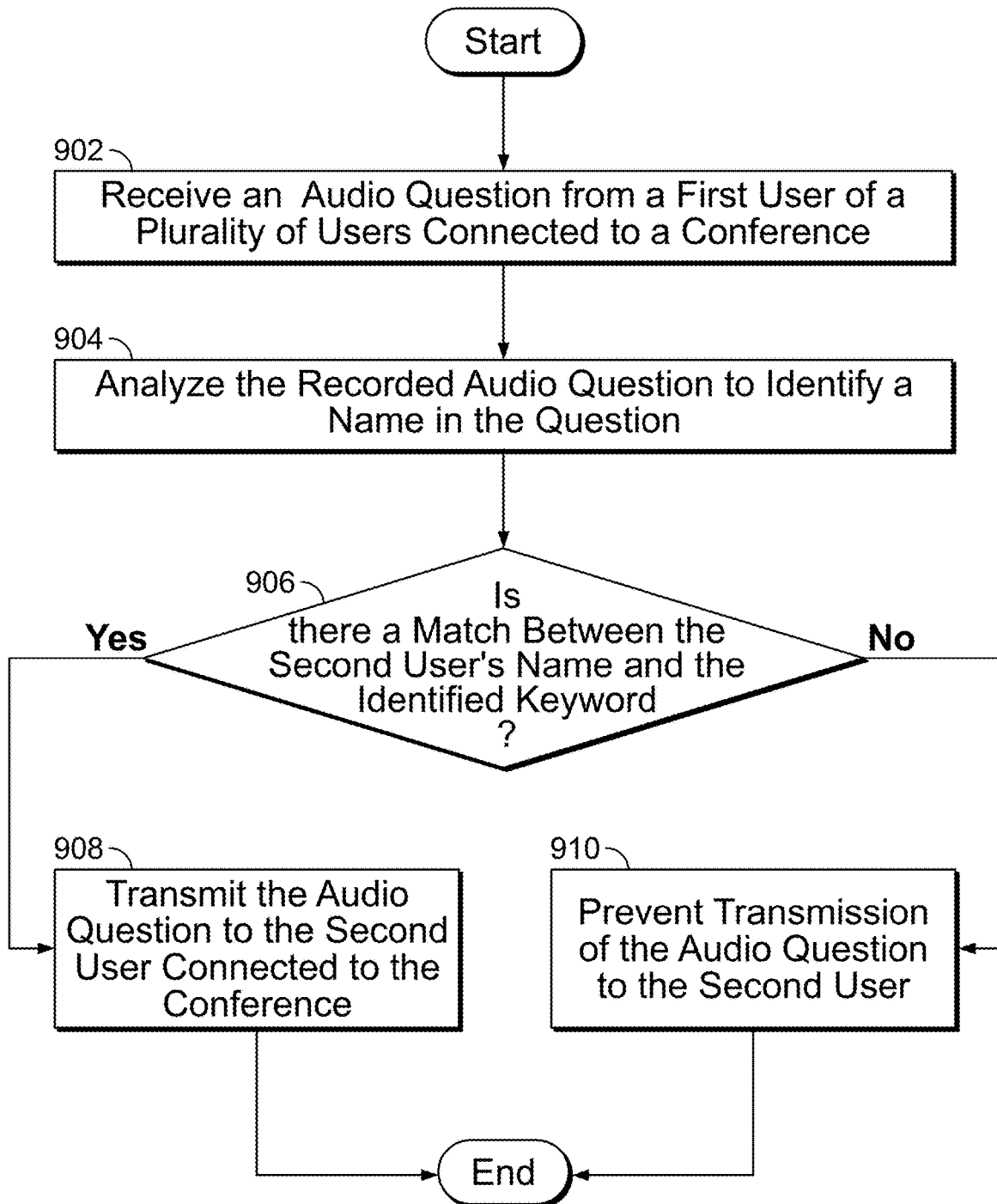
FIG. 9 is a flowchart of illustrative steps involved in determining whether an asked question is relevant to a user, in accordance with disclosed methods and embodiments.

FIG. 9 depicts a flowchart of a process 900 of illustrative steps involved in determining whether an asked question is relevant to a user, in accordance with some embodiments disclosed herein. It should be noted that process 900 or any step thereof could be performed on, or provided by, any of the devices shown in FIG. 11 and can incorporate various user interfaces (e.g., display screens of FIGS. 1-3). For example, process 900 may be executed by control circuitry 1128 (FIG. 11) of the user equipment 1118. In addition, one or more steps of process 900 may be incorporated into or combined with one or more steps of any other process or embodiment (e.g., process 400 of FIG. 4, process 500 of FIG. 5, process 600 of FIG. 6, process 700 of FIG. 7, process 800 of FIG. 8, process 1000 of FIG. 10).

At 902, an audio question is received from a first user of a plurality of users connected to a conference. At 904, the received audio question is recorded and analyzed to identify a name of one of more users in the question. For instance, the received audio question is analyzed to determine a specific name mentioned in the question (e.g., mention of the name "Jim Halpert").

At 906, the system determines whether there is a match between the second user's name and the identified name from the recorded question. If it is determined that there is no match between the second user's name and the identified name from the recorded question (NO at 906), the system proceeds to 910 and transmission of the audio question to the second user is prevented. If, on the other hand, it is determined that there is a match between the second user's name and the identified name from the recorded question (YES at 906), the system proceeds to 908. At 908, the audio question is transmitted to the second user. In this way, the question is transmitted only to the users to whom the question is directed to without interrupting other users connected to the conference.

Figure 10:
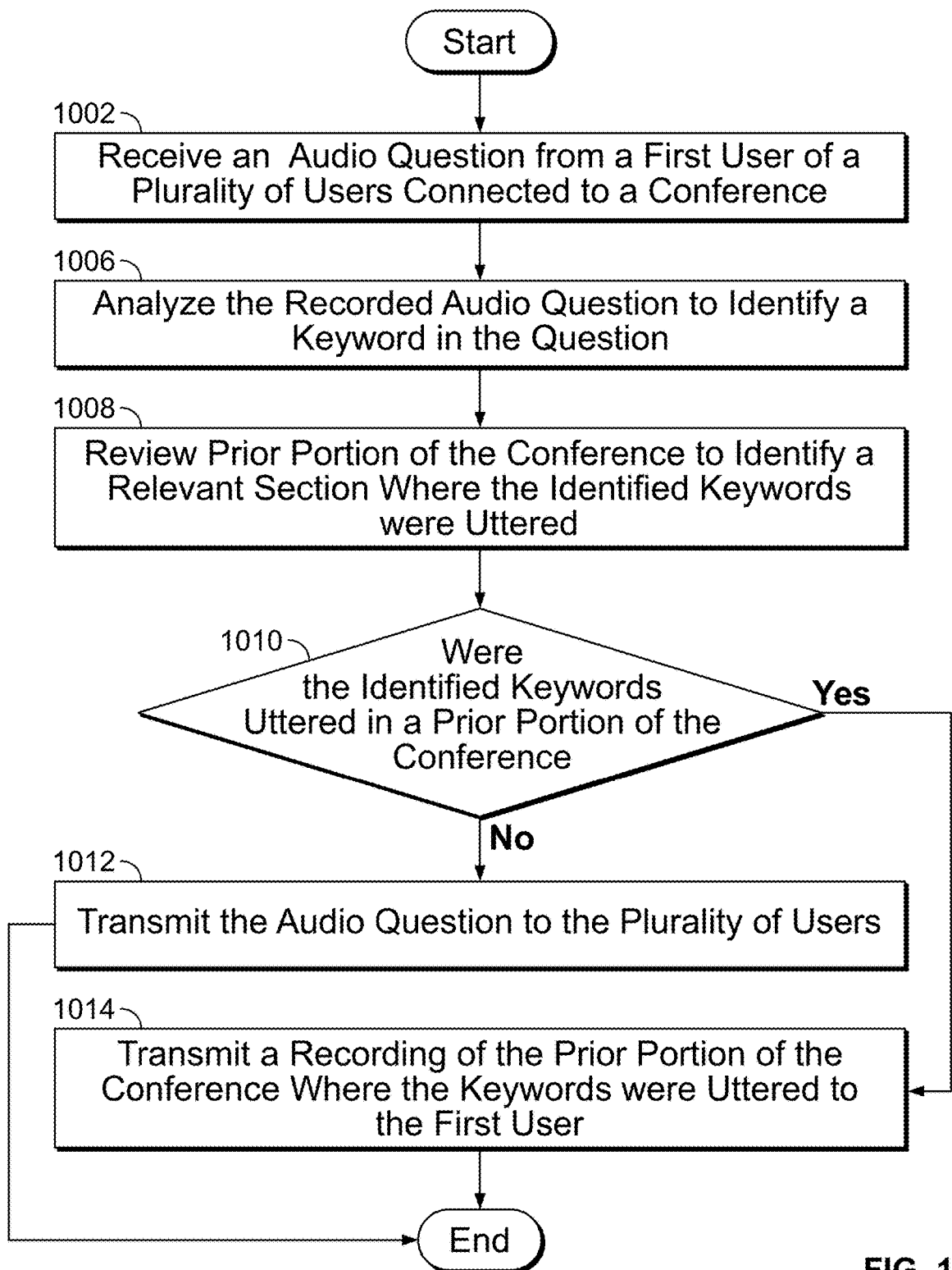
FIG. 10 is a flowchart of illustrative steps involved in determining whether an asked question was previously answered during a prior portion of the conference, in accordance with disclosed methods and embodiments.

FIG. 10 depicts a flowchart of a process 1000 of illustrative steps involved in determining whether an asked question was previously answered during a prior portion of the conference, in accordance with some embodiments disclosed herein. It should be noted that process 1000 or any step thereof could be performed on, or provided by, any of the devices shown in FIG. 11 and can incorporate various user interfaces (e.g., display screens of FIGS. 1-3). For example, process 1000 may be executed by control circuitry 1128 (FIG. 11) of the user equipment 1118. In addition, one or more steps of process 1000 may be incorporated into or combined with one or more steps of any other process or embodiment (e.g., process 400 of FIG. 4, process 500 of FIG. 5, process 600 of FIG. 6, process 700 of FIG. 7, process 800 of FIG. 8, process 900 of FIG. 9).

At 1002, an audio question is received from a first user of a plurality of users connected to a conference. At 1006, the received audio question is recorded and analyzed to identify a keyword in the question. For instance, the received audio question is analyzed to determine a specific topic mentioned in the question (e.g., mention of sales numbers). At 1008, the system analyzes the prior portion of the conference to identify a relevant section where the identified keyword was uttered.

At 1010, the system determines whether the identified keyword from the recorded question was uttered previously during the conference. For example, when the question asked refers to sale numbers of widgets, the system determines whether the sale numbers were discussed during a prior portion of the conference. If it is determined that the identified keyword from the recorded question was not uttered previously during the conference (NO at 1010), the system proceeds to 1012 and the audio question is transmitted to the plurality of users connected to the conference. If, on the other hand, it is determined that the identified keyword from the recorded question was uttered previously during the conference (YES at 1010), the system proceeds to 1014 and a recording of the relevant portion of the conference when the identified keyword is uttered is transmitted to the first user. For example, if the sale of widgets were discussed during the first ten minutes of the conference, a recording of the first ten minutes of the conference are transmitted to the first user. However, the question is prevented from being transmitted to the other participants connected to the conference, thereby preventing unnecessary interruptions to the conference.

Figure 11:
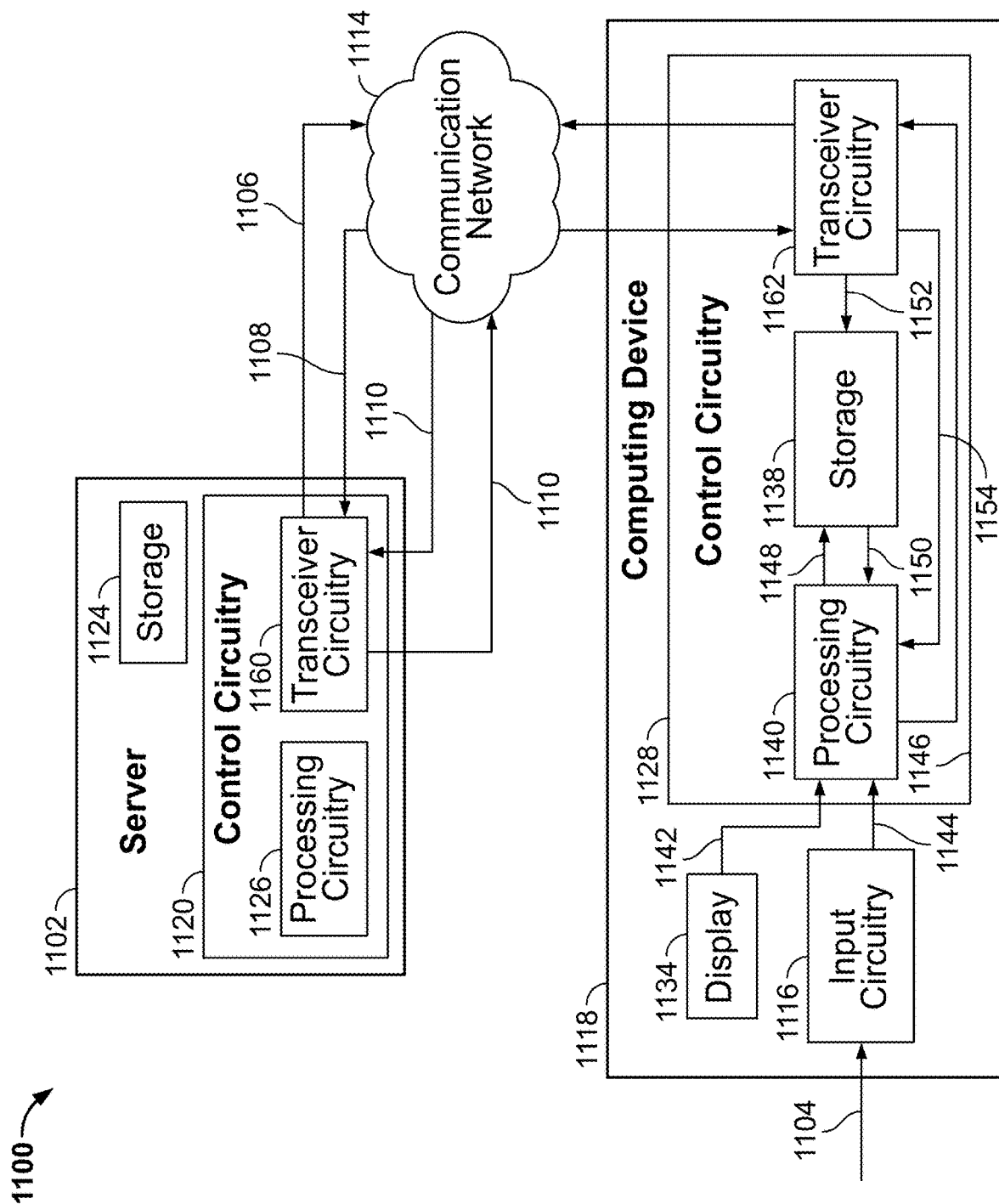
FIG. 11 is a block diagram representing devices, components of each device, and data flow therebetween for an audio/video conferencing system incorporating question management features, in accordance with some embodiments of the disclosure.

FIG. 11 is an illustrative block diagram showing an audio/video conferencing system incorporating question management features, in accordance with some embodiments of the disclosure. In FIG. 11, an audio/video conferencing system is configured as an audio/video conferencing system 1100, in accordance with some embodiments of the disclosure. In an embodiment, one or more parts of or the entirety of system 1100 may be configured as a system implementing various features, processes, and components of FIGS. 1-10. Although FIG. 11 shows a certain number of components, in various examples, system 1100 may include fewer than the illustrated number of components and/or multiples of one or more of the illustrated number of components.

System 1100 is shown to include a computing device 1118, a server 1102 and a communication network 1114. It is understood that while a single instance of a component may be shown and described relative to FIG. 11, additional instances of the component may be employed. For example, server 1102 may include, or may be incorporated in, more than one server. Similarly, communication network 1114 may include, or may be incorporated in, more than one communication network. Server 1102 is shown communicatively coupled to computing device 1118 through communication network 1114. While not shown in FIG. 11, server 1102 may be directly communicatively coupled to computing device 1118, for example, in a system absent or bypassing communication network 1114.

Communication network 1114 may comprise one or more network systems, such as, without limitation, an Internet, LAN, WIFI or other network systems suitable for audio processing applications. In some embodiments, system 1100 excludes server 1102, and functionality that would otherwise be implemented by server 1102 is instead implemented by other components of system 1100, such as one or more components of communication network 1114. In still other embodiments, server 1102 works in conjunction with one or more components of communication network 1114 to implement certain functionality described herein in a distributed or cooperative manner. Similarly, in some embodiments, system 1100 excludes computing device 1118, and functionality that would otherwise be implemented by computing device 1118 is instead implemented by other components of system 1100, such as one or more components of communication network 1114 or server 1102 or a combination. In still other embodiments, computing device 1118 works in conjunction with one or more components of communication network 1114 or server 1102 to implement certain functionality described herein in a distributed or cooperative manner.

Computing device 1118 includes control circuitry 1128, display 1134 and input circuitry 1116. Control circuitry 1128 in turn includes transceiver circuitry 1162, storage 1138 and processing circuitry 1140. In some embodiments, computing device 1118 or control circuitry 1128 may be configured as media devices 102, 202, or 302 of FIGS. 1, 2, and 3, respectively.

Server 1102 includes control circuitry 1120 and storage 1124. Each of storages 1124 and 1138 may be an electronic storage device. As referred to herein, the phrase "electronic storage device" or "storage device" should be understood to mean any device for storing electronic data, computer software, or firmware, such as random-access memory, read-only memory, hard drives, optical drives, digital video disc (DVD) recorders, compact disc (CD) recorders, BLU-RAY disc (BD) recorders, BLU-RAY 3D disc recorders, digital video recorders (DVRs, sometimes called personal video recorders, or PVRs), solid state devices, quantum storage devices, gaming consoles, gaming media, or any other suitable fixed or removable storage devices, and/or any combination of the same. Each storage 1124, 1138 may be used to store various types of content, metadata, and or other types of data (e.g., they can be used to record audio questions asked by one or more participants connected to the conference. Non-volatile memory may also be used (e.g., to launch a boot-up routine and other instructions). Cloud-based storage may be used to supplement storages 1124, 1138 or instead of storages 1124, 1138. In some embodiments, the audio portion of the conference may be recorded and stored in one or more of storages 1112, 1138.

In some embodiments, control circuitry 1120 and/or 1128 executes instructions for an application stored in memory (e.g., storage 1124 and/or storage 1138). Specifically, control circuitry 1120 and/or 1128 may be instructed by the application to perform the functions discussed herein. In some implementations, any action performed by control circuitry 1120 and/or 1128 may be based on instructions received from the application. For example, the application may be implemented as software or a set of executable instructions that may be stored in storage 1124 and/or 1138 and executed by control circuitry 1120 and/or 1128. In some embodiments, the application may be a client/server application where only a client application resides on computing device 1118, and a server application resides on server 1102.

The application may be implemented using any suitable architecture. For example, it may be a stand-alone application wholly implemented on computing device 1118. In such an approach, instructions for the application are stored locally (e.g., in storage 1138), and data for use by the application is downloaded on a periodic basis (e.g., from an out-of-band feed, from an Internet resource, or using another suitable approach). Control circuitry 1128 may retrieve instructions for the application from storage 1138 and process the instructions to perform the functionality described herein. Based on the processed instructions, control circuitry 1128 may determine a type of action to perform in response to input received from input circuitry 1116 or from communication network 1114. For example, in response to a user selection of "Smart Presentation" mode, control circuitry 1128 may perform the steps of process 400 (FIG. 4), process 500 (FIG. 5), process 600 (FIG. 6), process 700 (FIG. 7), process 800 (FIG. 8), process 900 (FIG. 9), process 1000 (FIG. 10), or processes relative to various embodiments, such as the example of FIGS. 1, 2, and 3.

In client/server-based embodiments, control circuitry 1128 may include communication circuitry suitable for communicating with an application server (e.g., server 1102) or other networks or servers. The instructions for carrying out the functionality described herein may be stored on the application server. Communication circuitry may include a cable modem, an Ethernet card, or a wireless modem for communication with other equipment, or any other suitable communication circuitry. Such communication may involve the Internet or any other suitable communication networks or paths (e.g., communication network 1114). In another example of a client/server-based application, control circuitry 1128 runs a web browser that interprets web pages provided by a remote server (e.g., server 1102). For example, the remote server may store the instructions for the application in a storage device. The remote server may process the stored instructions using circuitry (e.g., control circuitry 1128) and/or generate displays. Computing device 1118 may receive the displays generated by the remote server and may display the content of the displays locally via display 1134. This way, the processing of the instructions is performed remotely (e.g., by server 1102) while the resulting displays, such as the display windows described elsewhere herein, are provided locally on computing device 1118. Computing device 1118 may receive inputs from the user via input circuitry 1116 and transmit those inputs to the remote server for processing and generating the corresponding displays. Alternatively, computing device 1118 may receive inputs from the user via input circuitry 1116 and process and display the received inputs locally, by control circuitry 1128 and display 1134, respectively.

Server 1102 and computing device 1118 may transmit and receive content and data such as media content via communication network 1114. For example, server 1102 may be a media content provider, and computing device 1118 may be a smart television configured to download or stream media content, such as a Harry Potter episode, from server 1102. Control circuitry 1120, 1128 may send and receive commands, requests, and other suitable data through communication network 1114 using transceiver circuitry 1160, 1162, respectively. Control circuitry 1120, 1128 may communicate directly with each other using transceiver circuits 1160, 1162, respectively, avoiding communication network 1114.

It is understood that computing device 1118 is not limited to the embodiments and methods shown and described herein. In nonlimiting examples, computing device 1118 may be a television, a Smart TV, a set-top box, an integrated receiver decoder (IRD) for handling satellite television, a digital storage device, a digital media receiver (DMR), a digital media adapter (DMA), a streaming media device, a DVD player, a DVD recorder, a connected DVD, a local media server, a BLU-RAY player, a BLU-RAY recorder, a personal computer (PC), a laptop computer, a tablet computer, a WebTV box, a personal computer television (PC/TV), a PC media server, a PC media center, a handheld computer, a stationary telephone, a personal digital assistant (PDA), a mobile telephone, a portable video player, a portable music player, a portable gaming machine, a smartphone, or any other device, computing equipment, or wireless device, and/or combination of the same capable of suitably displaying and manipulating media content.

Control circuitry 1120 and/or 1118 may be based on any suitable processing circuitry such as processing circuitry 1126 and/or 1140, respectively. As referred to herein, processing circuitry should be understood to mean circuitry based on one or more microprocessors, microcontrollers, digital signal processors, programmable logic devices, field-programmable gate arrays (FPGAs), application-specific integrated circuits (ASICs), etc., and may include a multi-core processor (e.g., dual-core, quad-core, hexa-core, or any suitable number of cores). In some embodiments, processing circuitry may be distributed across multiple separate processors, for example, multiple of the same type of processors (e.g., two Intel Core i9 processors) or multiple different processors (e.g., an Intel Core i7 processor and an Intel Core i9 processor). In some embodiments, control circuitry 1120 and/or control circuitry 1118 are configured to implement a media content operation system, such as systems, or parts thereof, that perform various media content manipulation processes described and shown in connection with FIGS. 4-8 and/or systems carrying out the features described and shown relative to FIGS. 1-3.

Computing device 1118 receives a user input 1104 at input circuitry 1116. For example, computing device 1118 may receive a user input like a user swipe or user touch, as previously discussed. In some embodiments, computing device 1118 is a media device (or player) configured as media devices 102, 202, or 302, with the capability to access media content. It is understood that computing device 1118 is not limited to the embodiments and methods shown and described herein. In nonlimiting examples, computing device 1118 may be a television, a Smart TV, a set-top box, an integrated receiver decoder (IRD) for handling satellite television, a digital storage device, a digital media receiver (DMR), a digital media adapter (DMA), a streaming media device, a DVD player, a DVD recorder, a connected DVD, a local media server, a BLU-RAY player, a BLU-RAY recorder, a personal computer (PC), a laptop computer, a tablet computer, a WebTV box, a personal computer television (PC/TV), a PC media server, a PC media center, a handheld computer, a stationary telephone, a personal digital assistant (PDA), a mobile telephone, a portable video player, a portable music player, a portable gaming machine, a smartphone, or any other television equipment, computing equipment, or wireless device, and/or combination of the same.

User input 1104 may be received from a user selection-capturing interface that is separate from device 1118, such as a remote-control device, trackpad or any other suitable user movement sensitive or capture devices, or as part of device 1118, such as a touchscreen of display 1134. Transmission of user input 1104 to computing device 1118 may be accomplished using a wired connection, such as an audio cable, USB cable, ethernet cable or the like attached to a corresponding input port at a local device, or may be accomplished using a wireless connection, such as Bluetooth, WIFI, WiMAX, GSM, UTMS, CDMA, TDMA, 3G, 4G, 4G LTE, or any other suitable wireless transmission protocol. Input circuitry 1116 may comprise a physical input port such as a 3.5 mm audio jack, RCA audio jack, USB port, ethernet port, or any other suitable connection for receiving audio over a wired connection, or may comprise a wireless receiver configured to receive data via Bluetooth, WIFI, WiMAX, GSM, UTMS, CDMA, TDMA, 3G, 4G, 4G LTE, or other wireless transmission protocols.

Processing circuitry 1140 may receive input 1104 from input circuit 1116. Processing circuitry 1140 may convert or translate the received user input 1104 that may be in the form of gestures or movement to digital signals. In some embodiments, input circuit 1116 performs the translation to digital signals. In some embodiments, processing circuitry 1140 (or processing circuitry 1126, as the case may be) carries out disclosed processes and methods. For example, processing circuitry 1140 or processing circuitry 1126 may perform processes 400, 500, 600, 700, 800, 900, and 1000 of FIGS. 4-10, respectively.

The systems and processes discussed above are intended to be illustrative and not limiting. One skilled in the art would appreciate that the actions of the processes discussed herein may be omitted, modified, combined, and/or rearranged, and any additional actions may be performed without departing from the scope of the invention. More generally, the above disclosure is meant to be exemplary and not limiting. Only the claims that follow are meant to set bounds as to what the present disclosure includes. Furthermore, it should be noted that the features and limitations described in any one embodiment may be applied to any other embodiment herein, and flowcharts or examples relating to one embodiment may be combined with any other embodiment in a suitable manner, done in different orders, or done in parallel. In addition, the systems and methods described herein may be performed in real time. It should also be noted that the systems and/or methods described above may be applied to, or used in accordance with, other systems and/or methods.

What is claimed is:

1. A method comprising the steps of:
receiving an audio question from a first user of a plurality of users connected to a conference;
recording the audio question and preventing an immediate transmission of the audio question to the plurality of users connected to the conference;
analyzing the recorded audio question to determine that the audio question is relevant to a second user of the plurality of users and not relevant to a third user of the plurality of users;
preventing the audio question from being transmitted to the third user; and
transmitting the audio question to the second user of the plurality of users,
wherein determining that the audio question is relevant to the second user comprises:
  analyzing the recorded audio question to identify a keyword referenced in the question;
  cross-referencing the identified keyword with a plurality of keywords associated with a respective background of each of the plurality of users to find a match; and
  determining that the audio question is relevant to the second user based on determining a match between the identified keyword referenced in the audio question and the plurality of keywords associated with the background of the second user, and
wherein the steps are executed by a processor.

2. The method of claim 1, wherein determining that the audio question is relevant to the second user comprises:
analyzing the recorded audio question to determine that a name of the second user was referenced.

3. The method of claim 1, wherein the plurality of keywords associated with a respective background of each of the plurality of users comprise of a job title of each of the plurality of users.

4. The method of claim 1, wherein determining that the audio question is not relevant to the third user comprises:
analyzing the recorded audio question to determine that a name of the third user was not referenced.

5. A method comprising the steps of:
receiving an audio question from a first user of a plurality of users connected to a conference;
recording the audio question and preventing an immediate transmission of the audio question to the plurality of users connected to the conference;
analyzing the recorded audio question to determine that the audio question is relevant to a second user of the plurality of users and not relevant to a third user of the plurality of users;
preventing the audio question from being transmitted to the third user; and
transmitting the audio question to the second user of the plurality of users,
wherein determining that the audio question is not relevant to the third user comprises:
  analyzing the recorded audio question to identify a keyword referenced in the question;
  cross-referencing the identified keyword with a plurality of keywords associated with a respective background of each of the plurality of users to find a match; and
  determining that the audio question is not relevant to the third user based on determining a lack of a match between the identified keyword referenced in the audio question and the plurality of keywords associated with the background of the third user, and
wherein the steps are executed by a processor.

6. The method of claim 5, wherein the plurality of keywords associated with a respective background of each of the plurality of users comprise of a job title of each of the plurality of users.

7. The method of claim 1, wherein transmitting the audio question to the second user comprises:
transmitting the audio recording in a new window on an electronic device of the second user.

8. The method of claim 1, wherein transmitting the audio question to the second user comprises:
transmitting a selectable icon notifying the second user of the audio question by the first user; and
in response to detecting a selection of the selectable icon, transmitting the recorded audio question to an electronic device of the second user.

9. The method of claim 1, wherein the audio question is recorded in response to determining that the conference is in a smart presentation mode.

10. A system comprising:
an input circuitry configured to receive an audio question from a first user of a plurality of users connected to a conference; and
control circuitry configured to:
record the audio question and prevent an immediate transmission of the audio question to the plurality of users connected to the conference;
analyze the recorded audio question to determine that the audio question is relevant to a second user of the plurality of users and not relevant to a third user of the plurality of users;
prevent the audio question from being transmitted to the third user; and
transmit the audio question to the second user of the plurality of users,
wherein the control circuitry, when determining that the audio question is not relevant to the third user, is configured to:
analyze the recorded audio question to identify a keyword referenced in the question;
cross-reference the identified keyword with a plurality of keywords associated with a respective background of each of the plurality of users to find a match; and
determine that the audio question is not relevant to the third user based on determining a lack of a match between the identified keyword referenced in the audio question and the plurality of keywords associated with the background of the third user.

11. The system of claim 10, wherein the control circuitry, when determining that the audio question is relevant to the second user, is configured to:
analyze the recorded audio question to determine that a name of the second user was referenced.

12. The system of claim 10, wherein the control circuitry, when determining that the audio question is relevant to the second user, is configured to:
analyze the recorded audio question to identify a keyword referenced in the question;
cross-reference the identified keyword with a plurality of keywords associated with a respective background of each of the plurality of users to find a match; and
determine that the audio question is relevant to the second user based on determining a match between the identified keyword referenced in the audio question and the plurality of keywords associated with the background of the second user.

13. The system of claim 12, wherein the plurality of keywords associated with a respective background of each of the plurality of users comprise of a job title of each of the plurality of users.

14. The system of claim 10, wherein the control circuitry, when determining that the audio question is not relevant to the third user, is configured to:
analyze the recorded audio question to determine that a name of the third user was not referenced.

15. The system of claim 10, wherein the plurality of keywords associated with a respective background of each of the plurality of users comprise of a job title of each of the plurality of users.

16. The system of claim 10, wherein the control circuitry, when transmitting the audio question to the second user, is configured to:
transmit the audio recording in a new window on an electronic device of the second user.

17. The system of claim 10, wherein the control circuitry, when transmitting the audio question to the second user, is configured to:
transmit a selectable icon notifying the second user of the audio question by the first user; and
in response to detecting a selection of the selectable icon, transmit the recorded audio question to an electronic device of the second user.

18. The system of claim 10, wherein the audio question is recorded in response to determining that the conference is in a smart presentation mode.

* * * * *